United States Patent
Aoki et al.

(10) Patent No.: US 6,767,409 B2
(45) Date of Patent: Jul. 27, 2004

(54) METHOD FOR CLEANING SEMICONDUCTOR WAFER AFTER CHEMICAL MECHANICAL POLISHING ON COPPER WIRING

(75) Inventors: Hidemitsu Aoki, Tokyo (JP); Shinya Yamasaki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 117 days.

(21) Appl. No.: 10/075,566

(22) Filed: Feb. 13, 2002

(65) Prior Publication Data

US 2002/0144710 A1 Oct. 10, 2002

Related U.S. Application Data

(62) Division of application No. 09/313,027, filed on May 17, 1999.

(30) Foreign Application Priority Data

May 20, 1998 (JP) .......................................... 10-138365

(51) Int. Cl.$^7$ .............................. B08B 3/08; C23G 1/02
(52) U.S. Cl. ............................... 134/28; 134/29; 134/2; 134/3
(58) Field of Search ............................... 134/28, 29, 2, 134/3, 26, 41, 902; 510/175, 176; 216/38, 88; 438/692, 693, 906

(56) References Cited

U.S. PATENT DOCUMENTS

| | | | |
|---|---|---|---|
| 5,290,361 A | * 3/1994 | Hayashida et al. | ............. 134/2 |
| 5,454,901 A | 10/1995 | Tsuji | |
| 5,498,293 A | * 3/1996 | Ilardi et al. | ..................... 134/3 |
| 5,676,760 A | 10/1997 | Aoki et al. | |
| 5,762,779 A | 6/1998 | Shiramizu et al. | |
| 5,783,790 A | 7/1998 | Mitsumori et al. | |
| 5,927,305 A | 7/1999 | Shiba | |
| 6,082,373 A | 7/2000 | Sakuurai et al. | |
| 6,115,867 A | 9/2000 | Nakashima et al. | |
| 6,156,661 A | 12/2000 | Small | |
| 6,165,956 A | * 12/2000 | Zhang et al. | ................ 510/175 |
| 6,199,563 B1 | 3/2001 | Uehara | |
| 6,277,203 B1 | * 8/2001 | Jiang et al. | ..................... 134/2 |
| 6,303,551 B1 | * 10/2001 | Li et al. | ...................... 510/175 |
| 6,423,148 B1 | * 7/2002 | Aoki | ............................. 134/3 |

FOREIGN PATENT DOCUMENTS

| | | |
|---|---|---|
| JP | 6-116770 | 4/1994 |
| JP | 6-196461 | 7/1994 |
| JP | 7-263430 | 10/1995 |
| JP | 9-100494 | 4/1997 |
| JP | 9-157692 | 6/1997 |

OTHER PUBLICATIONS

"APOST–CMP Cleaning of W and SiO2: A Model Study", by Igor J. Malik, et al., 1995 Materials Research Society, Soc. Symp. Proc. vol. 386, pp. 109–114.
A Electrochemistry Handbook, 4th edition, pp. 276–277.

* cited by examiner

*Primary Examiner*—Frankie L Stinson
*Assistant Examiner*—Saeed Chaudhry
(74) *Attorney, Agent, or Firm*—Scully, Scott, Murphy & Presser

(57) ABSTRACT

A copper wiring is desirable for a high-speed logic circuit integrated on a semiconductor substrate, and is patterned through a chemical mechanical polishing, wherein polishing particles are brushed away from the major surface of the resultant semiconductor structure by using aqueous ammonia at 0.0001–0.5 weight percent, catholyte or hydrogen-containing water without damage to the copper wiring, and, thereafter, metallic contaminants such as copper is removed by using washer containing decontaminating agent selected from polycarboxylic acid, ammonium salts thereof and polyaminocarboxylic acid also without damage to the copper wiring.

16 Claims, 7 Drawing Sheets

METHOD FOR CLEANING SEMICONDUCTOR WAFER AFTER CHEMICAL MECHANICAL POLISHING ON COPPER WIRING

CROSS REFERENCE TO RELATED APPLICATION

The present application is a divisional of copending application Ser. No. 09/313,027 filed on May 17, 1999.

FIELD OF THE INVENTION

This invention relates to a wafer cleaning technology and, more particularly, to a method for cleaning a semiconductor wafer after a chemical mechanical polishing on a copper wiring.

DESCRIPTION OF THE RELATED ART

One of the technical goals for a semiconductor logic circuit device is a high-speed logic function. A copper wiring is attractive, because the electric resistance is low and the anti-electromigration property is good. The copper wiring is employed in the semiconductor logic circuit device. Although the copper wiring is desirable in view of the electric resistance and the anti-electromigration property, a copper layer is hardly patterned through a dry etching. The copper wiring is usually patterned as follows. First, a groove is formed in an insulating layer, and barrier metal such as titanium or tantalum and copper are successively deposited over the entire surface of the insulating layer. The entire surface of the insulating layer is covered with the barrier metal, and defines a secondary groove in the groove. The copper fills the secondary groove, and swells into a copper layer spread over the upper surface of the barrier metal layer. The copper layer and the barrier metal layer are chemically mechanically polished until the insulating layer is exposed, again. The copper is left in the secondary groove, and forms the copper wiring.

Polishing slurry is used in the chemical mechanical polishing, and contains polishing particles. Copper particles are produced during the chemical mechanical polishing. For this reason, when the copper wiring is completed, various kinds of contaminant are left on the surface of the insulating layer and the surface of the copper wiring. If the fabrication process is continued without any surface cleaning, the copper particles and other metallic contaminant such as Fe, Ca and K are diffused through the insulating layer, and reach the circuit components. The contaminant deteriorates the circuit components. Thus, the surface cleaning is indispensable, and is an important technology in the fabrication process.

The copper wiring is not limited to the semiconductor logic circuit device. Logic circuits are integrated on a semiconductor chip together with other function blocks such as, for example, a dynamic random access memory block, and the copper wiring is employed in those semiconductor integrated circuit devices.

The present inventors searched documents already published for a surface cleaning after the chemical mechanical polishing on the copper layer. However, the present inventors could not find any surface cleaning. For this reason, a surface cleaning after a chemical mechanical polishing on a tungsten player is hereinbelow described.

Titanium or titanium nitride is used as a barrier metal layer for the tungsten wiring, and the tungsten is deposited over the barrier metal layer. While a tungsten layer is being chemically mechanically polished, polishing slurry is supplied to the polishing pad. The polishing slurry contains alumina particles or silica particles dispersed in mixture of hydrogen peroxide and oxidizer. Upon completion of the chemical mechanical polishing, the alumina particles or the silica particles are left over the silicon wafer at 3000 particles per wafer. The tungsten powder is also left on the silicon wafer.

A known surface cleaning after the chemical mechanical polishing uses diluted hydrofluoric acid, and another known cleaning technology uses a brushing in aqueous ammonia and a centrifugal spray cleaning (see MRS. Symp., Proc. Vol. 386, pages 109 (1995) written by I. J. Malik et. al.) using citric acid. However, the diluted hydrogen peroxide is known as a kind of etchant. The titanium and the titanium nitride are etched in the diluted hydrofluoric acid at large etching rate. For this reason, the diluted hydrofluoric acid is not appropriate for the surface cleaning after the chemical mechanical polishing on the tungsten wiring laminated on the barrier metal layer.

The second prior art surface cleaning is available for the tungsten wiring. The aqueous ammonia contains the ammonia at 0.1–2 weight percent, and the particles are brushed away in the aqueous ammonia. Thereafter, the wafer is spun, and the citric acid is sprayed onto the tungsten wiring for removing the metallic contaminant.

SUMMARY OF THE INVENTION

It is therefore an important object of the present invention to provide a cleaning method after a chemical and mechanical polishing for a copper wiring without undesirable etching.

The present inventors evaluated the prior art cleaning technologies to see whether or not any one of them was available for a copper wiring. The present inventors prepared samples of copper wiring. Copper was formed on a barrier metal layer of titanium/titanium nitride through a metal plating and a chemical vapor deposition. The present inventors carried out the chemical mechanical polishing on the copper layers. Upon completion of the chemical mechanical polishing, the present inventors measured the copper contaminant. The copper contaminant was equal to or greater than $10^{12}$ atoms/cm$^2$.

The samples were cleaned through the prior art methods. The diluted hydrofluoric acid etches the barrier metal layer at a large etching rate, and was not available for the post cleaning. The present inventors brushed the samples in the aqueous ammonia. Although the aqueous ammonia removed the particles from the copper wiring, a large number of pits were produced in the exposed surface of the copper wiring. The aqueous ammonia reacted with the copper so as to produce ammonia complex, and the ammonia complex was dissolved. The copper was polycrytal, and the aqueous ammonia penetrated along the grain boundaries. This meant that the ammonia complex was produced along the grain boundaries, and the copper grains were separated. The citric acid did not etch the barrier metal layer. However, the citric acid at high concentration was required for removing the metallic contaminant such as Fe. The high-concentration citric acid increased the cleaning cost. The citric acid was an organic compound, and the amount of total carbon in the wastewater was not ignoreable. Thus, the second cleaning technology was also not available for the copper wiring.

In accordance with one aspect of the present invention, there is provided a method for cleaning a semiconductor wafer having a copper layer exposed to a surface thereof after a chemical mechanical polishing comprising the steps of a) treating the semiconductor wafer with a first washer selected from the group consisting of aqueous ammonia containing ammonia at 0.0001–0.5 weight percent, a catholyte between neutral and weak base and hydrogen containing water for removing polishing particles from the semiconductor wafer without damage to the copper layer and b) treating the semiconductor wafer with a second washer containing at least one decontaminating agent selected from the group consisting of polycarboxylic acids each capable of producing a chelate compound together with copper, ammonium salts of the polycarboxylic acids and polyaminocarboxylic acids for removing metallic contaminants from the semiconductor wafer.

In accordance another aspect of the present invention, there is provided another method for cleaning a semiconductor wafer having a tungsten layer exposed to a surface thereof after a chemical mechanical polishing comprising the steps of a) treating the semiconductor wafer with a first washer selected from the group consisting of aqueous ammonia containing ammonia at 0.0001–5 weight percent, a catholyte between neutral and weak base and hydrogen containing water for removing polishing particles from the semiconductor wafer without damage to the tungsten layer and b) treating the semiconductor wafer with a second washer containing at least one decontaminating agent selected from the group consisting of oxalic acid, ammonium oxalate and polyaminocarboxylic acids and ranging from 0.01 weight percent to 7 weight percent for removing metallic contaminants from the semiconductor wafer.

BRIEF DESCRIPTION OF THE DRAWINGS

The features and advantages of the surface cleaning method will be more clearly understood from the following description taken in conjunction with the accompanying drawings in which.

DESCRIPTION OF THE PREFERRED EMBODIMENTS

First Embodiment

Semiconductor Structure to be Cleaned

Figure 1:
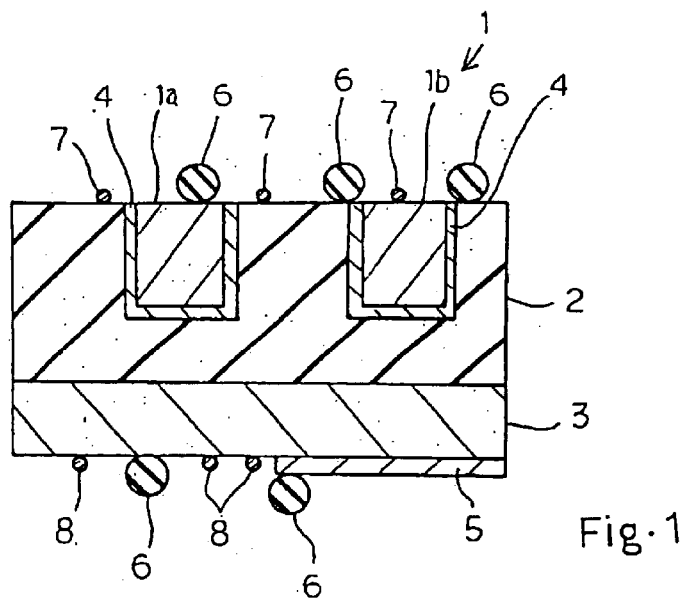
FIG. 1 is a cross sectional view showing a semiconductor structure to be cleaned through a method according to the present invention.

Referring to FIG. 1 of the drawings, a copper wiring 1 is embedded in an inter-level insulating layer 2 deposited over a silicon substrate 3. Grooves are formed in the inter-level insulating layer 2, and the inner surfaces defining the grooves are covered with barrier layers 4. The barrier layers 4 define secondary grooves, and copper strips 1a/1b are formed in the secondary grooves, respectively. The copper strips 1a/1b form parts of the copper wiring 1.

The inter-level insulating layer 2 is usually formed of silicon oxide. Another kinds of insulating material are smaller in dielectric constant than the silicon oxide, and are available for the inter-level insulating layer 2. These kinds of insulating material are, by way of example, organic compounds such as benzocyclobutene, parylene-N and CYTOP, inorganic material such as xerogel and silisesquiioxane and composite material between organic compound and inorganic material such as hydrogen peroxide/methylsilane-based CVD oxide. Although the dielectric constant of silicon oxide is 3.9–4.2, those kinds of insulating material range from 1.8 to 3.5. Especially, the hydrogen silisesquiioxane is attractive, because the dielectric constant ranges from 2.8 to 3.2 and the properties are stable. The barrier layers 4 are formed of tantalum or titanium nitride.

The copper wiring 1 is formed as follows. The insulating material is deposited over the entire surface of the silicon substrate 3, and forms the inter-level insulating layer 2. A photo-resist etching mask (not shown) is formed on the inter-level insulating layer 2 through a lithographic process, and the inter-level insulating layer 2 is selectively etched away. Then, the grooves are formed in the inter-level insulating layer 2. The barrier metal is deposited over the entire surface of the inter-level insulating layer 2 by using a physical vapor deposition technique or a chemical vapor deposition technique, and the barrier metal layer defines the secondary grooves. Copper is grown on the resultant semiconductor structure by suing a metal plating, a physical vapor deposition or a chemical vapor deposition. The copper fills the secondary grooves, and swells into a copper layer extending over the barrier metal layer. The copper 5 adheres to the reverse surface of the silicon substrate 3.

The copper layer is pressed against a polishing pad, and polishing slurry is supplied to the polishing pad. The polishing slurry contains polishing particles and oxidizer. Alumina particles are used as the polishing particles, and hydrogen peroxide and iron nitrate are examples of the oxidizer. The copper layer and the barrier metal layer are chemically mechanically polished until the inter-level insulating layer is exposed, again. Then, the semiconductor structure shown in FIG. 1 is obtained.

Upon completion of the chemical mechanical polishing, the alumina particles 6 are left on both surfaces of the resultant semiconductor structure. The alumina particles are more than 30000 per wafer. The copper contaminant on the inter-level insulating layer 2 and the copper wiring 1 is more than $10^{12}$ atoms/cm$^2$. If the polishing slurry contains K or Fe, K or Fe also contaminates the resultant semiconductor structure. The residual copper and the other metallic contaminants on the major surface are designated by reference numeral 7. As described hereinbefore, the copper adheres to the reverse surface of the silicon substrate, and the copper on the reverse surface is more than $10^{14}$ atoms/cm$^2$. The residual copper and the other metallic contaminants on the reverse surface are labeled with reference numeral 8.

The alumina particles and the metallic contaminant are undesirable for circuit components integrated on the silicon substrate 3, and are to be removed without any damage to the copper wiring 1. A brushing is appropriate to the alumina particles. However, a chemical treatment is required for the metallic contaminant. Thus, the polishing particles such as alumina particles and the metallic contaminant are to be removed through the different steps. In the following description, a cleaning for removing the polishing particles, a cleaning for removing metallic contaminants from the major surface and a cleaning for removing metallic contaminants from the reverse surface are referred to as "first cleaning", "second cleaning" and "third cleaning", respectively.

Removal of Polishing Particles

The polishing particles such as the alumina particles can be removed only through a brushing. The polishing particles tend to adhere to the surfaces of the semiconductor structure. In order to prevent the surfaces of the semiconductor structure from the polishing particles, electric repulsion between the polishing particles and the surfaces is utilized. If alkaline washer is used during the brushing, the polishing particles and the surfaces of the semiconductor structure are negatively charged, and the polishing particles repel the surfaces of the semiconductor structure. This means that the polishing particles do not adhere to the surfaces, again. In order to negatively charge the polishing particles and the surfaces of the semiconductor structure, the present inventors propose two kinds of washer for the brushing stage.

Aqueous ammonia is alkaline, and does not contaminate the semiconductor structure. However, if the ammonia is in high concentration, the ammonia reacts with copper, and the ammonia and the copper produce ammonia complex. The chemical reaction is expressed as

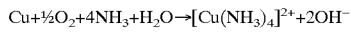

$$Cu + \tfrac{1}{2}O_2 + 4NH_3 + H_2O \rightarrow [Cu(NH_3)_4]^{2+} + 2OH^-$$

The present inventors experimentally determined the upper limit of the ammonia concentration at which the chemical reaction is ignoreable. The present inventors found that the polishing particles and the surfaces of the semiconductor structure were negatively charged in the aqueous ammonia ranging between 0.0001 weight percent and 0.5 weight percent without serious pits on the copper wiring 1. Thus, the first approach for the removal of the polishing particles was to control the ammonia concentration or the pH control of the aqueous ammonia, and the available range was from 0.0001 weight percent to 0.5 weight percent.

The present inventors further found that catholyte was available for the surface charges during the brushing. The catholyte was neutral, and was obtained through an electrolytic process as described in "Electrochemistry Handbook" 4$^{th}$ edition, page 277. A solid polymer electrolyte was sandwiched between a cathode and an anode. Pure water was electrolyzed by applying dc voltage, and the catholyte was obtained around the cathode. Ammonium ion might be added to the pure water, and was equal to or less then 0.5 weight percent. The resultant water containing the ammonium ion equal to or less than 0.5 weight percent was hereinbelow simply referred to as "ammonium-ion containing water".

Although the catholyte was neutral or weak base, the catholyte had strong reducing property due to the active hydrogen generated around the cathode. For this reason, the catholyte did not etch the copper wiring, and made the surface potential on the polishing particles and the surface potential on the semiconductor structure negative as similar to the aqueous ammonia in high concentration.

Quasi catholyte was also available for the washer. Hydrogen had been produced during the electrolytic process, and dissolved in the catholyte. The present inventors dissolved hydrogen into the pure water or the ammonium-containing water equal to or less than 0.5 weight percent through the bubbling of hydrogen. The hydrogen-containing water was referred to as "quasi-catholyte". The quasi-catholyte made the polishing particle and the surfaces of the semiconductor wafer negatively charged. The present inventors confirmed that the polishing particles were removed through the brushing in the quasi-catholyte without the pits.

The catholyte and the quasi-catholyte has an oxidation-reduction potential preferably ranging from −1000 milli-volts to −300 milli-volts by using a silver chloride pole as a reference electrode. The oxidation-reduction potential between −800 milli-volts and −600 milli-volts was more preferable. The ammonia concentration in the catholyte or the ammonium-ion containing water was preferably between 0.0005 weight percent and 0.01 weight percent, and the hydrogen concentration in the catholyte or the ammonium-ion containing water preferably ranged from 0.1 ppm to 10 ppm.

The present inventors compared the cleaning methods according to the present invention with the prior art cleaning method. The washer used in the prior art cleaning method was the aqueous ammonia at 1.8 weight percent, and the etching rate and the number of pits were measured after the prior art cleaning in the aqueous ammonia at 1.8 weight percent. The semiconductor structure shown in FIG. 1 was dipped in the aqueous ammonia at 1.8 weight percent, and the pits were counted after 10 minutes.

The washer used in the first cleaning method according to the present invention was the aqueous ammonia at 0.0002 weight percent, and the etching rate and the number of pits were measured after the cleaning in the aqueous ammonia at 0.0002 weight percent. The semiconductor structure shown in FIG. 1 was dipped in the aqueous ammonia at 0.0002 weight percent, and the pits were counted after 10 minutes.

The washer used in the second cleaning method according to the present invention was the catholyte obtained from the pure water, and the etching rate and the number of pits were measured. The semiconductor structure shown in FIG. 1 was dipped in the catholyte, and the pits were counted after 10 minutes.

Figure 2:
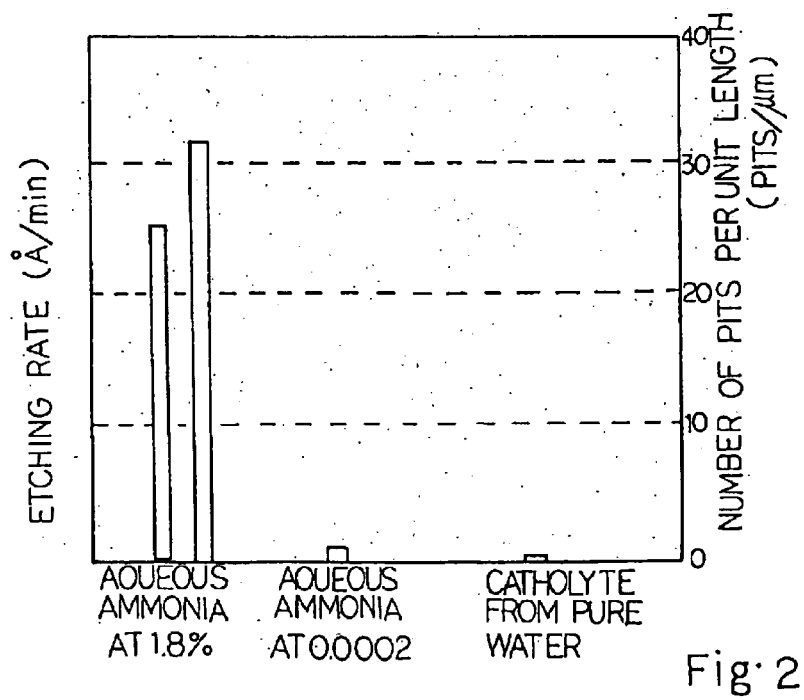
FIG. 2 is a graph showing etching rates and a pit density during a cleaning method according to the present invention and during the prior art cleaning method.

The etching rate on a copper layer and the number of pits on the copper layer per unit length were plotted in FIG. 2. The etching rate in the aqueous ammonia at 1.8 weight percent was 50 angstroms per minute, and the pits were thirty-two per micron. On the other hand, the etching rate in the aqueous ammonia at 0.0002 weight percent was only 2 angstroms per minute, and the pit was not observed. The etching rate in the catholyte was less than 1 angstrom per minute, and any pit was not observed.

Figure 3:
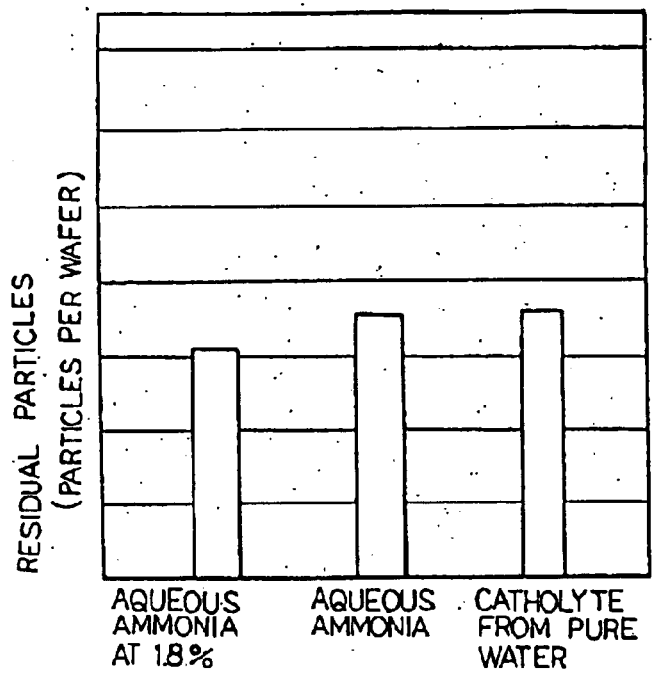
FIG. 3 is a graph showing the number of residual polishing particles in terms of the washer.

The present inventors counted the residual polishing particles after the brushing, and the number of residual polishing particles was plotted in FIG. 3. Upon completion of the chemical mechanical polishing, the residual particle on the silicon oxide layer produced from tetraethylorthosilicate, i.e., TEOS was equal to or greater than 30000 per each wafer. The present inventors continued the brushing in the three kinds of washer for 60 seconds. The three kinds of washer were the aqueous ammonia at 1.8 weight percent, the aqueous ammonia at weight 0.0002 percent and the catholyte obtained through the electrolytic process in the pure water, respectively.

After the brushing, the present inventors counted the residual polishing particles on each wafer, and plotted the number of residual polishing particles in FIG. 3. The residual polishing particles fell in the range between 30 per wafer and 40 per wafer. Thus, the present inventors confirmed that the aqueous ammonia in low concentration and the catholyte were effective against the residual polishing particles as similar to the aqueous ammonia at 1.8 percent, and achieved the residual polishing particles less than 100 particles per wafer.

As will be understood from the foregoing description, when the brushing is carried out in the aqueous ammonia at 0.0001–0.5 weight percent, the catholyte obtained from the pure water or the water containing the ammonium ion equal to or less than 0.5 weight percent or the quasi-catholyte, the residual polishing particles 6 are removed from the resultant semiconductor structure 1/2/3 without serious pits in the copper wiring 1.

If the copper wiring is embedded in the inter-level insulating layer formed of the insulating material except the silicon oxide, the catholyte obtained from the pure water and the quasi-catholyte without the ammonia are more desirable than the aqueous ammonia and the catholyte/quasi-catholyte obtained from the aqueous ammonia, because the ammonia is causative of etching and increase of dielectric constant as shown in table 1. In table 1, "HSQ" is representative of the hydrogen silisesquiioxane, and "SiO" is representative of silicon oxide.

TABLE 1

| Washer | Etching rate (angstroms/min) | | Dielectric Constant of HSQ | |
|---|---|---|---|---|
| | HSQ | SiO | Before | After |
| $NH_4OH$ (pH:9) | 40 | 2 | 2.9 | 4.2 |
| Catholyte from Pure water | <1 | <1 | 2.9 | 2.9 |
| Quasi-catholyte | <1 | <1 | 2.9 | 2.9 |
| Oxalic acid at 1% | <1 | <1 | 2.9 | 2.9 |

Removal of Metallic Contaminant From Major Surface

The aqueous ammonia is in low concentration so that the aqueous ammonia and the copper do not produce any ammonia complex. This means that the metallic contaminant 7 such as copper oxide is removed in the next step.

Although a centrifugal spray cleaning is desirable for the removal of the metallic contaminants 7, the brushing is available for the second step. The metallic contaminants 7 such as Cu are removed by using several kinds of washer. Polycarboxylic acid for producing copper chelate compound is available for the washer. The washer contains the polycarboxylic acid at 0.01–7 weight percent, and oxalic acid is an example of the polycarboxylic acid. The copper strip 5 on the reverse surface (see FIG. 1) is removed by using washer containing hydrofluoric acid and hydrogen peroxide.

The present inventors evaluated the oxalic acid and citric acid after the removal of polishing particles by using rolling brushes for a predetermined time between 20–60 seconds. The present inventors measured residual metallic contaminants K, Fe and Cu on wafers. The wafers were cleaned by using washer containing citric acid at 5 weight percent for a predetermined time between 15 seconds and 30 seconds, and other wafers were cleaned by using different washer containing oxalic acid at 0.1 weight percent for the predetermined time.

Figure 4:
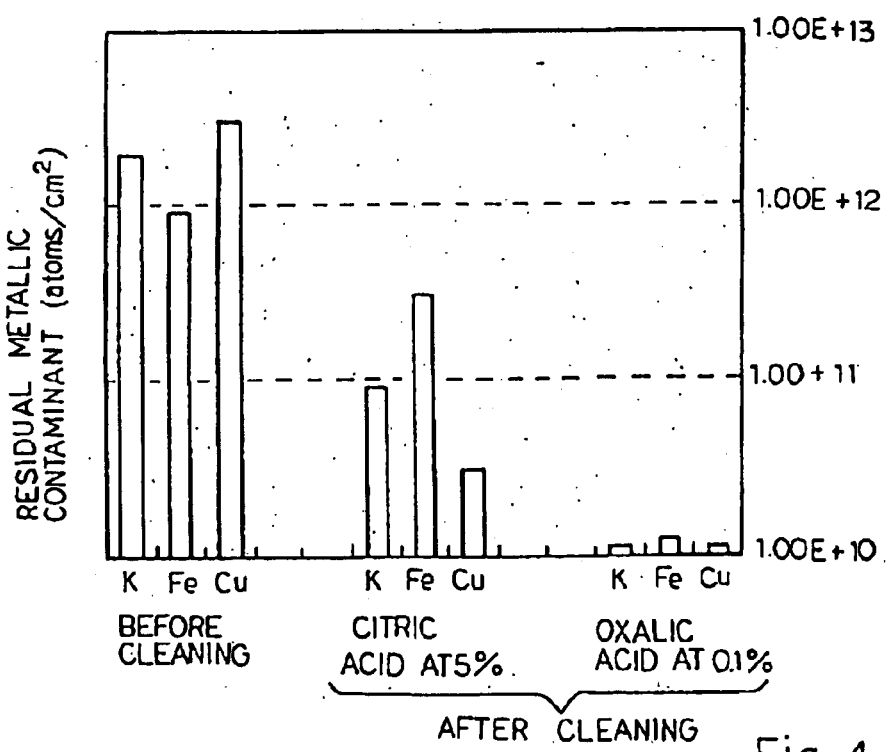
FIG. 4 is a graph showing three kinds of residual metallic contaminant after a cleaning using different kinds of washer.

After the second cleaning, the present inventors measured the residual metallic contaminants, and plotted them in FIG. 4. Comparing the washer containing the citric acid with the washer containing the oxalic acid, it was understood that the washer containing the oxalic acid drastically reduced the residual metallic contaminants. The etching rate of the oxalic acid to the copper was negligible. The good cleaning capability without etching was derived from production of chelate complex. The oxalic acid easily reacted with the residual copper contaminant, and produced copper chelate complex. However, the copper atoms formed the copper strip 5 through the metallic bond. For this reason, the copper atoms of the strip 5 hardly reacted with the oxalic acid, and the production of copper chelate complex was little. The barrier layers 4 of TiN, Ta, TaN or TaSiN did not produce chelate complex together with the oxalic acid, and were not etched in the washer containing the oxalic acid. The oxalic acid did not etch the inter-level insulating layer 2, nor increased the dielectric constant (see table 1). Thus, the washer containing oxalic acid was preferable for the removal of the metallic contaminants without damage to the resultant semiconductor structure. Although the washer containing citric acid was not so large in cleaning capability as the washer containing oxalic acid, the residual metallic contaminants were fairly reduced, and the washer containing citric acid was available for the first cleaning.

The present inventors evaluated two kinds of washer as follows. The present inventors fabricated samples of the semiconductor structure shown in FIG. 1. The inter-level insulating layer 2 was formed of silicon oxide produced from tetraethylorthosilicate (TEOS), and the barrier layers 4 of tantalum and the copper strips 1a/1b were embedded in the inter-level insulating layer 2. As described in conjunction with FIG. 1, the barrier layers 4 and the copper strips 1a/1b were formed through the chemical mechanical polishing.

Figure 5:
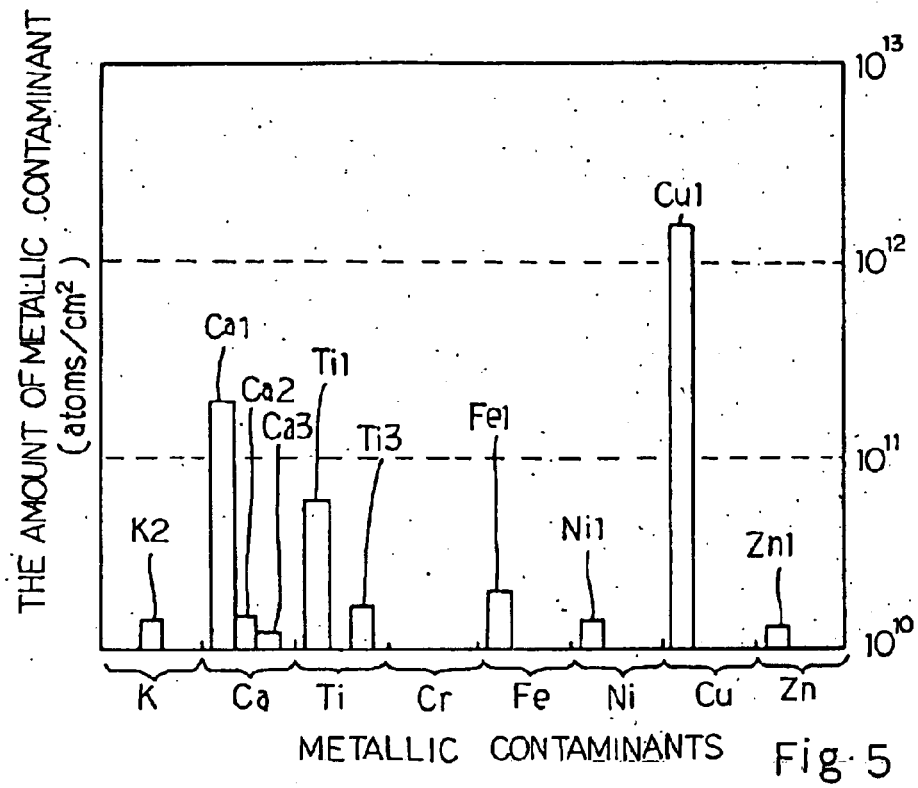
FIG. 5 is a graph showing residual metallic contaminants after treatments with different kinds of washer.

The samples were divided into two groups. The residual polishing particles were brushed away from the samples of the first group for a predetermined time period between 20 seconds and 60 seconds by using the aqueous ammonia at 0.001 weight percent. Upon completion of the first cleaning, the present inventors measured the metallic contaminants K, Ca, Ti, Cr, Fe, Ni, Cu and Zn. K and Cr were not detected, and Ca, Ti, Fe, Ni, Cu and Zn were plotted as indicated by Ca1, Ti1, Fe1, Ni1, Cu1 and Zn1 (see FIG. 5).

The residual metallic contaminants were removed from the samples of the first group through a centrifugal spray cleaning using the washer containing the oxalic acid. The washer was sprayed for a predetermined time between 15 seconds and 30 seconds. The samples seemed to be contaminated with K after the first cleaning, and K was detected as indicated by K2. However, Ca, was drastically reduced as indicated by Ca2, and Ti, Cr, Fe, Ni, Cu and Zn were perfectly removed from the samples.

The residual polishing particles were removed from the samples of the second group through the brushing for the predetermined time between 20 seconds and 60 seconds in the catholyte obtained from pure water, and, thereafter, the metallic contaminants were removed through the centrifugal spray cleaning using the washer containing the oxalic acid. The centrifugal spray cleaning was also continued for the predetermined time between 15 seconds and 30 seconds. K, Fe, Ni, Cu and Zn were not detected, and residual Ca and residual Ti were indicated by Ca3 and Ti3, respectively.

Thus, the washer according to the present invention removed residual Cu as well as other metallic contaminants, and the other metallic contaminants did not exceed $2 \times 10^{10}$ atoms/$cm^2$. Thus, the present inventors confirmed that the washer containing oxalic acid was effective against the metallic contaminants.

As will be understood from the foregoing description, the washer containing oxalic acid is effective against the residual metallic contaminants 7. The residual copper and other metallic contaminants 7 are removed from the surfaces of the semiconductor structure without damage to the copper wiring 1.

If any copper strip is not left on the reverse surface of the semiconductor structure, both surfaces of the semiconductor structure may be cleaned by using the washer containing oxalic acid. Other polycarboxylic acids, ammonium salts thereof such as, for example, oxalate and polyaminocarboxylic acids are available for the washer in the second cleaning in so far as they produce chelate compounds. Examples available for the washer instead of oxalic acid are citric acid, D-tartaric acid, L-tartaric acid, malein acid, malonic acid, malic acid and ammonium salts thereof. Although the activation capacibility is not so large as the other examples, succinic acid can produce a chelate compound. If the manufacturer prolongs the cleaning time, the succinic acid is also available for the second cleaning.

Figure 6:
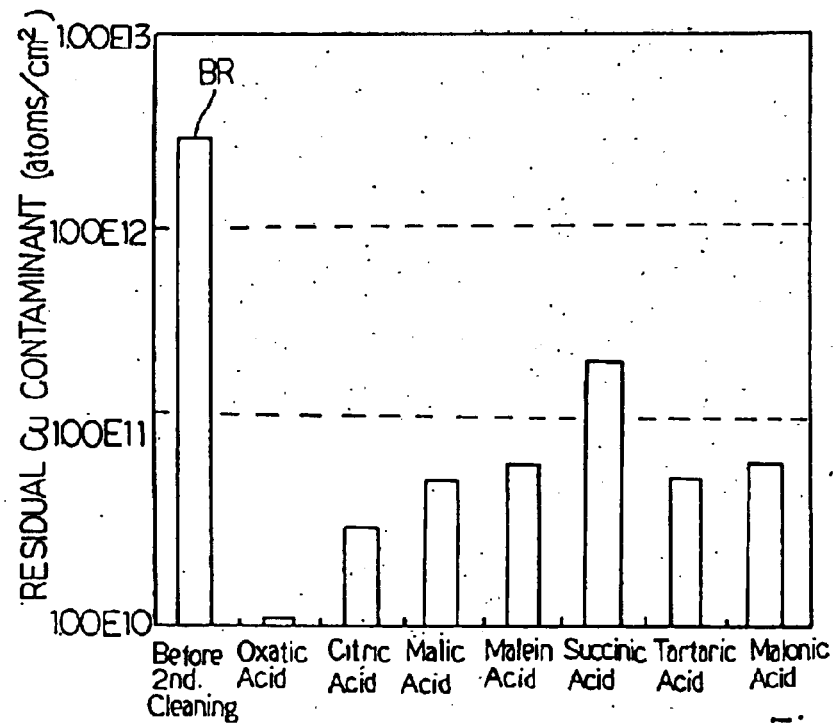
FIG. 6 is a graph showing residual copper contaminant after treatments with different organic acids.

The present inventors evaluated the above-described polycarboxylic acids as follows. The present inventors prepared samples of the semiconductor structure shown in FIG. 1, and the residual polishing particles were brushed away for a predetermined time between 20 seconds and 60 seconds by using the aqueous ammonia at 0.001 weight percent. The residual copper contaminants on the major surfaces of the samples were indicated by plots BR (see FIG. 6).

The present inventors further prepared various kinds of washer. These kinds of washer respectively contained oxalic acid, citric acid, malic acid, malein acid, succinic acid, tartaric acid and malonic acid in water at 1 weight percent. The samples were dipped in those kinds of washer for 2 minutes, and the present inventors measured the residual copper contaminants. The residual copper was plotted in FIG. 6. The residual copper was surely reduced after the dipping. Although the residual copper contaminant after the treatment with the washer containing succinic acid was relatively high, the residual copper contaminant was lowered by increasing either concentration or cleaning time. Thus, the present inventors confirmed that the polycarboxylic acids were effective against the copper contaminant.

Removal of Copper Strip and Contaminants From Reverse Surface

On the other hand, if the copper strip 5 is on the reverse surface of the semiconductor structure, the third cleaning is required. The second cleaning and the third cleaning would be concurrently carried out.

The third cleaning is carried out by using washer containing hydrofluoric acid and hydrogen peroxide. The hydrofluoric acid, the hydrogen peroxide and water are mixed into the ratio of 1–10:1–10:200. Although the copper atoms form the copper strip 5 through the metallic bond, the copper is dissolved in the liquid mixture. However, the diluted hydrofluoric acid can not remove the copper strip 5, because the copper is not ionized.

Figure 7:
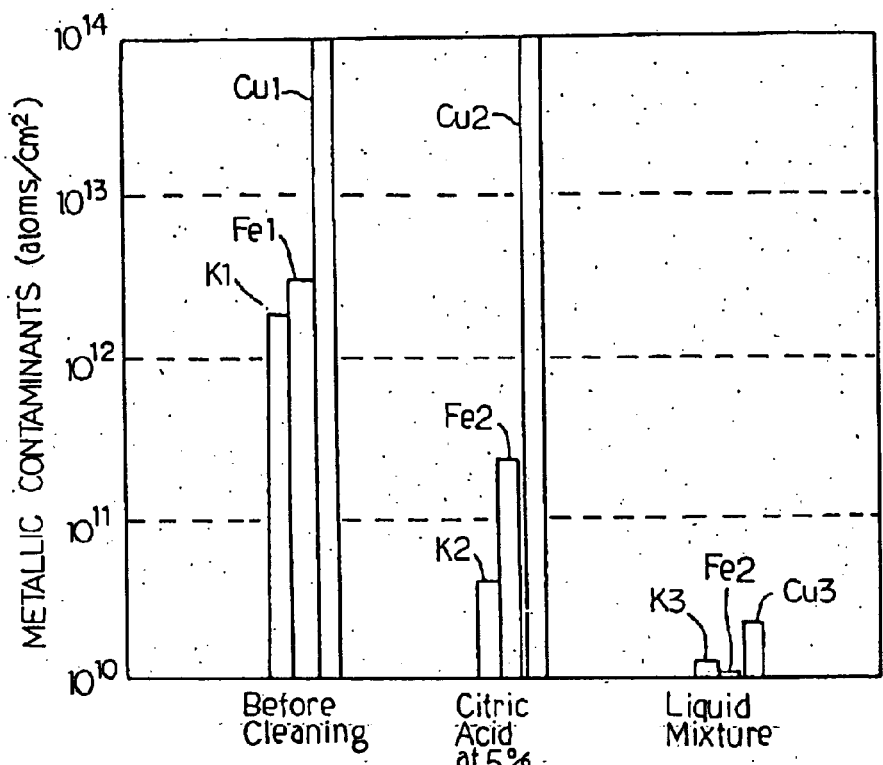
FIG. 7 is a graph showing residual metallic contaminants on reverse surfaces after treatments with different kinds of washer.
Figure 9:
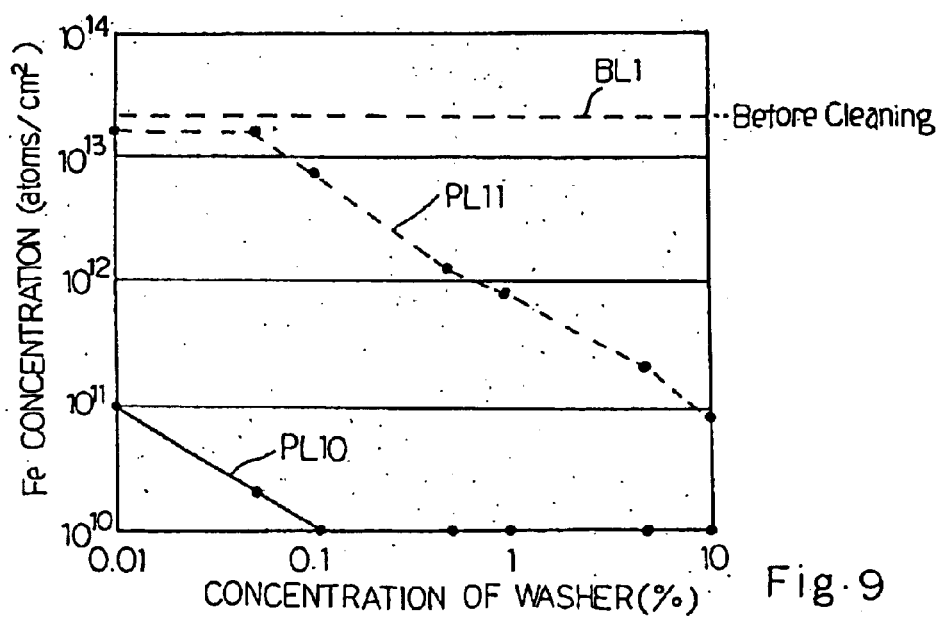
FIG. 9 is a graph showing Fe concentration in terms of oxalic acid/citric acid concentration.

The present inventors evaluated the liquid mixture as follows. The present inventors prepared samples of the semiconductor structure shown in FIG. 1, and residual polishing particles were brushed away for a predetermined time between 20 seconds and 60 seconds, and the aqueous ammonia at 0.001 weight percent was sprayed to the samples during the brushing. The present inventors measured metallic contaminants K, Fe and Cu on the reverse surfaces of the samples before the third cleaning. The metallic contaminants on the reverse surfaces were plotted in FIG. 7. The amount of residual potassium, the amount of residual iron and the amount of residual copper were indicated by plots K1, Fe1 and Cu1, respectively.

The present inventors divided the samples into two groups. The first group was treated with washer containing citric acid at 5 weight percent. The washer containing citric acid was sprayed onto the reverse surfaces of the samples of the first group for a predetermined time period between 15 seconds and 30 seconds during the rotation of the samples. Although the residual potassium and the residual iron were reduced as indicated by plots K2 and Fe2, the washer was not effective against the residual copper strip 5 as indicated by plots Cu2.

The second group was treated with the liquid mixture, i.e., the aqueous solution containing the hydrofluoric acid and the hydrogen peroxide. The liquid mixture was sprayed onto the reverse surfaces of the samples of the second group during the rotation of the samples, and the second cleaning was continued for the predetermined time between 15 seconds and 30 seconds. The liquid mixture was effective against the copper strip 5, and all the metallic contaminants, i.e., potassium, iron and copper were drastically reduced to less than $2 \times 10^{10}$ atoms/cm$^2$ as indicated by plots K3, Fe3 and Cu3. Thus, the present inventors confirmed that the third cleaning was effective against the copper strip 5 and the metallic contaminants 8 without damage to the copper wiring 1 and the barrier layers 4.

Second Embodiment

Figure 8:
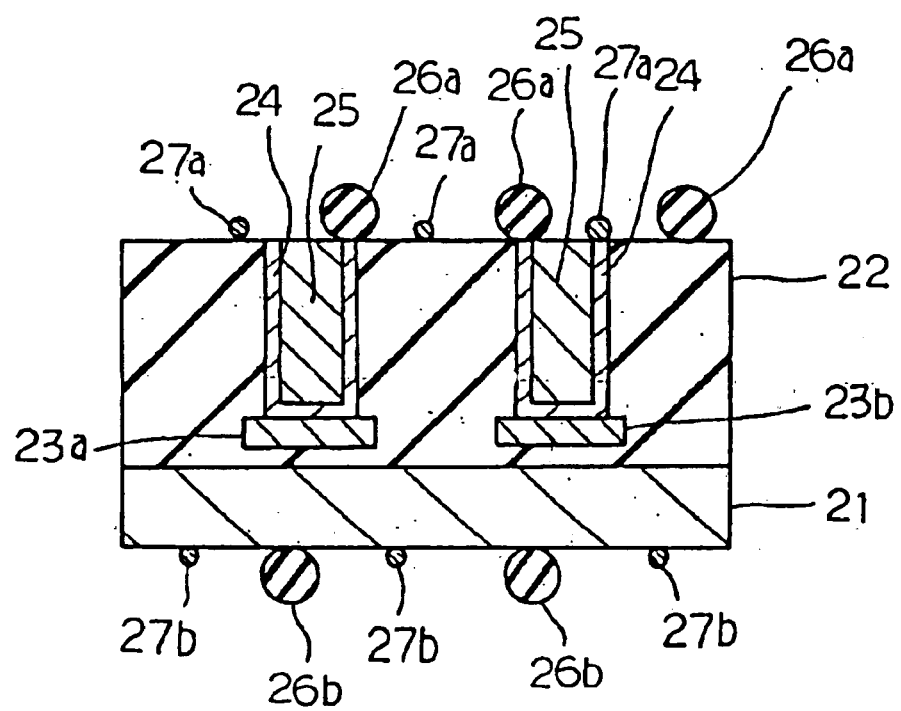
FIG. 8 is a cross sectional view showing another semiconductor structure to be cleaned through a method according to the present invention.

Turning to FIG. 8 of the drawings, another semiconductor structure is fabricated on a silicon substrate 21. The silicon substrate 21 is covered with an inter-level insulating layer 22, and lower wiring strips 23a/23b are wrapped in the inter-level insulating layer 22. The inter-level insulating layer 22 is formed of silicon oxide or other insulating materials described in conjunction with the first embodiment. Hydrogen silisesquiioxane is desirable for the inter-level insulating layer 22. Contact holes are formed in the inter-level insulating layer 22, and the lower wiring strips 23a/23b are exposed to the contact holes, respectively. The lower wiring strips 23a/23b are formed of aluminum or copper.

Titanium or titanium nitride is deposited over the entire surface of the resultant semiconductor structure, and forms a titanium/titanium nitride layer. The titanium/titanium nitride layer conformably extends over the entire surface of the resultant semiconductor structure, and defines secondary contact holes. Tungsten is deposited over the titanium/titanium nitride layer by using a chemical vapor deposition or a sputtering. The tungsten fills the secondary contact holes, and forms a tungsten layer over the inter-level insulating layer 22.

The tungsten layer and the titanium/titanium nitride layer are chemically mechanically polished until the inter-level insulating layer 22 is exposed, again. While a polishing pad is polishing the tungsten layer and the titanium/titanium nitride layer, polishing slurry is supplied onto the polishing pad. The polishing slurry contains polishing particles such as silica particles mixed in liquid mixture containing oxidizing agents such as hydrogen peroxide and iron nitrate.

Upon completion of the chemical mechanical polishing, barrier layers 24 and tungsten plugs 25 are left in the secondary contact holes. The silica particles 26a/26b are left on the major surface and the reverse surface of the semiconductor structure, respectively, and are 30000 particles per wafer. Fe in the polishing slurry contaminates the semiconductor structure, and is of the order of $10^{12}$ atoms/cm$^2$. If polishing slurry contains K or Cu, these contaminate the semiconductor structure. The metallic contaminant or contaminants are labeled with 27a/27b in FIG. 8.

The polishing particles and the metallic contaminants are removed from the major surface and the reverse surface of the semiconductor structure through a method similar to that in the first embodiment.

First, the polishing particles 26a/26b are removed through a brushing in aqueous ammonia at 0.0001–5 weight percent, the catholyte or the quasi-catholyte. The ammonia content in the catholyte or the quasi-catholyte ranges from zero to 5 weight percent. The tungsten is less soluble in the aqueous ammonia, and the manufacturer is less careful in the first cleaning.

Subsequently, the metallic contaminant 27a/27b is removed from the semiconductor structure. Washer used in the second cleaning is aqueous solution containing oxalic acid at 0.01–5 weight percent. Even if the oxalic acid concentration is increased to 7 weight percent, the tungsten plugs 25 and the barrier layers 24 are not damaged. The washer may contain ammonium oxalate or one of the polyaminocarboxylic acids instead of the oxalic acid. The ammonium oxalate and the polyaminocarboxylic acids range from 0.01 weight percent to 7 weight percent. However, the citric acid is not available as described in connection with the prior art. A centrifugal spray cleaning is desirable for the second cleaning. Alternatively, a brushing is available for the second cleaning.

In order to remove a metallic strip and the metallic contaminant from the reverse surface, the third cleaning may be carried out by using the liquid mixture or the aqueous solution containing hydrofluoric acid and hydrogen peroxide.

The polishing slurry containing Fe is usually used for the chemical mechanical polishing on the tungsten, and the washer is expected to remove the iron contaminant equal to or greater than $10^{12}$ atoms/cm$^2$. The iron on the silicon oxide layer is in the form of $FeO_x$. The oxalic acid produces a chelate complex, and the chelate complex is removed from the semiconductor structure.

The present inventors evaluated the washer. The present inventors prepared samples of the semiconductor structure, and the inter-level insulating layer 22 was contaminated with Fe through a chemical mechanical polishing. The initial contaminant was more than $10^{13}$ atoms/cm$^2$ as indicated by broken line BL1. The samples were divided into two groups. The present inventors further prepared the first series of washer containing oxalic acid at different concentrations and the second series of washer containing citric acid at different concentrations. The oxalic acid concentration was 0.05 weight percent, 0.1 weight percent, 0.5 weight percent, 1 weight percent and 5 weight percent. The citric acid concentration was also 0.05 weight percent, 0.1 weight percent, 0.5 weight percent, 1 weight percent and 5 weight percent.

Using the centrifugal spray cleaning system, the present inventors treated the samples of the first group with the first series of washer, and the residual Fe concentration was plotted as indicated by plots PL10. The present inventors treated the samples of the second group with the second series of washer, and the residual Fe concentration was plotted as indicated by plots PL11. Comparing plots PL10 with plots PL11, the first group was much lower in Fe concentration than the second group. Although the washer containing citric acid at 10 percent achieved the Fe concentration of the order of $10^{11}$ atoms/cm$^2$, the same Fe concentration was achieved by the washer containing oxalic acid at 0.01 percent.

Oxalic acid in the washer does not react with the tungsten plugs 25 and the titanium/titanium nitride barrier layers 24, because tungsten and titanium/titanium nitride form the plugs 25 and the barrier layers 24 through the metal bond. This means that oxalic acid does not damage the tungsten plugs 25 and the titanium/titanium nitride barrier layers 24 (see table 2).

TABLE 2

| | Etching rate (angstrom/min) | | | | | |
|---|---|---|---|---|---|---|
| | Cu | TiN | Ta | TaN | W | Ti |
| Oxalic acid at 0.1% | <1 | <1 | <1 | <1 | <1 | <1 |
| Citric acid at 5% | <1 | <1 | <1 | <1 | <1 | <1 |
| DHF at 0.5% | 2 | <1 | <1 | <1 | <1 | 50 |

In table 2, DHF is representative of diluted hydrofluoric acid.

As will be understood from the foregoing description, the polishing particles and the metallic contaminants are removed from the semiconductor structure through the first cleaning and the second cleaning without damage to the tungsten plugs 25 and the barrier layers 24.

Cleaning Sequence for First/Second Embodiments

Figure 10:
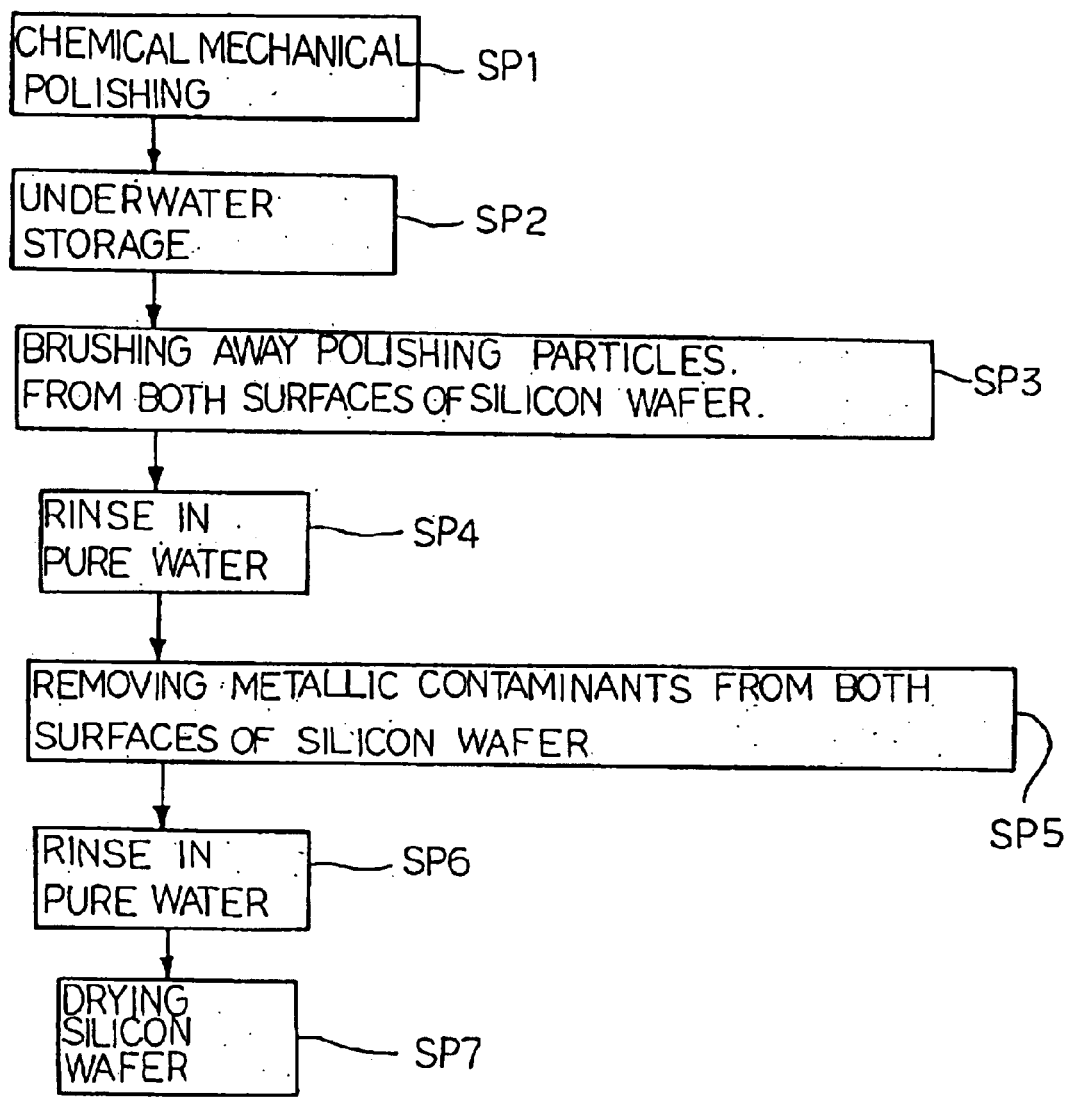
FIG. 10 is a flow chart showing a cleaning sequence for the first and second embodiments.

FIG. 10 shows a cleaning sequence for the semiconductor structure shown in FIG. 1 or 8. The cleaning sequence starts with preparation of the semiconductor structure shown in FIG. 1 or 8. Namely, the copper wiring 1 or the tungsten plugs 25 are formed on each silicon wafer through the chemical mechanical polishing as by step SP1. The silicon wafers are stored in a loader of a cleaning system as by step SP2. An underwater storage is desirable, because the underwater storage prevents the silicon wafers from dryness. If the silicon wafer is dried, the dryness makes the removal of the polishing particles difficult. It is appropriate to continuously supply fresh pure water to the loader. The fresh pure water prevents the copper wiring 1 from erosion due to the oxidizing agent dissolved into the pure water. Alternatively, the silicon wafers are sprayed with the pure water in the loader. Since the copper wiring 1 is much liable to the eroded, it is desirable to combine the chemical mechanical polishing apparatus with the cleaning system. The combined system is speedy so that the copper wiring 1 is less eroded.

Figure 11A:
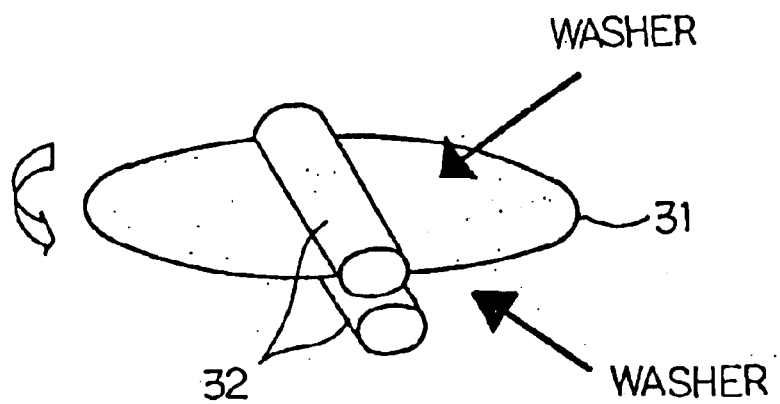
FIGS. 11A and 11B are perspective views showing essential steps in the cleaning sequence.

Subsequently, the polishing particles are brushed away from both surfaces of the silicon wafer as by step SP3. In detail, the silicon wafer 31 is sandwiched between rolling brushes 32 (see FIG. 11A). While the silicon wafer 31 is rotating, the washer is supplied to both surfaces of the silicon wafer 31. The washer is the aqueous ammonia at 0.001 weight percent, by way of example, and the brushing is continued for 20–60 seconds. The washer is supplied onto the silicon wafer in the vicinity of the brushes 32. The washer may be dropped onto the brushes 32 or sprayed from the inside of the brushes 32.

The washer was described in detail in conjunction with the removal of polishing particles in the first embodiment and the second embodiment. The catholyte may be used as the washer. When the catholyte is obtained from pure water, pH is 7.0, and the oxidation-reduction potential is −650 milli-volt with the reference electrode of AgCl. If the water contains a small amount of ammonium ion, pH of the catholyte may be 8.2, and the oxidation-reduction potential may be −770 milli-volts. The quasi-catholyte is also available for the removal of polishing particles. Hydrogen is bubbled in the pure water or the aqueous ammonia, and the quasi-catholyte is obtained through the hydrogen bubbling. Disk-shaped brushes may be used in step SP3.

Subsequently, the silicon wafer 31 is rinsed in pure water for 5–20 seconds as by step SP4. The residual ammonia is removed from both surfaces of the silicon wafer 31.

Figure 11B:
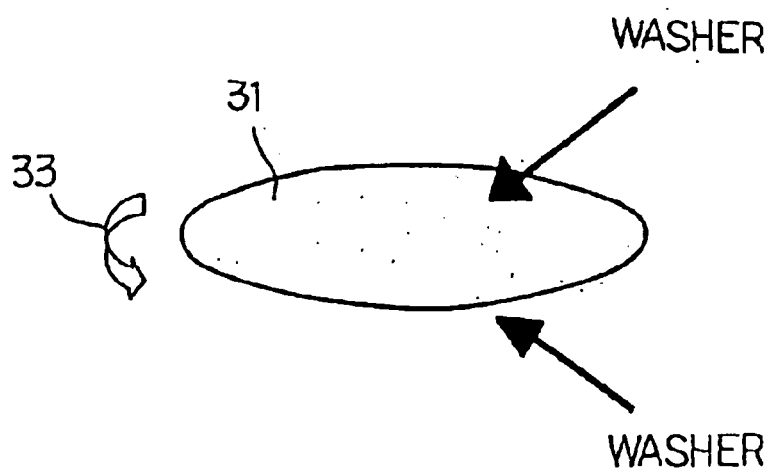

Subsequently, the metallic contaminants are removed from both surfaces of the silicon wafer as by step SP5. The semiconductor wafer 31 is placed on a rotor (not shown), and is spun as indicated by arrow 33 (see FIG. 11B). Washer is sprayed to both surfaces of the silicon wafer 31 for 15–30 seconds. The washer used in step SP5 is described in connection with the first and second embodiments.

When the copper strip 5 is left on the reverse surface, different kinds of washer are respectively supplied to the major surface and the reverse surface of the silicon wafer 31. The washer containing oxalic acid at 0.5 percent is sprayed onto the major surface of the silicon wafer 31 so as to remove the metallic contaminants without damage to the copper wiring 1, and the washer containing hydrofluoric acid and hydrogen peroxide is sprayed onto the reverse surface of the silicon wafer 31 so as to remove the copper strip 5 as well as the metallic contaminants. Hydrofluoric acid, hydrogen peroxide and pure water may be regulated to 1:1:100. However, if any metal strip is not left on the reverse surface, the washer containing oxalic acid is sprayed onto both surfaces of the silicon wafer.

Subsequently, the silicon wafer 31 is rinsed in pure water for 10–30 seconds as by step SP6. Finally, the silicon wafer 31 is dried by using a spin dryer as by step SP7. Finally, the silicon wafer is transferred to an unloader (snow shown).

The cleaning system may have the first chamber for the first cleaning and the second chamber for the second cleaning. If the total time for steps SP3 and SP4 is equal to the total time for steps Sp5 and SP6, the silicon wafers 31 are sequentially subjected to the first cleaning and the second cleaning without any waiting time. The first chamber is should be perfectly separated from the second chamber, because the alkaline washer and the acid washer produce salt.

The semiconductor structure shown in FIG. 8 is sequentially subjected to the first cleaning and the second cleaning as similar to the semiconductor structure shown in FIG. 1. The tungsten is less oxidized, and the manufacturer is allowed to speed down. However, it is preferable to carry out the first and second cleanings speedy.

EXAMPLES

The present inventors confirmed the cleaning process on various examples as follows. In all the examples, the inter-level insulating layers were formed of silicon oxide.

First Example

A silicon wafer was chemically mechanically polished, and the semiconductor structure shown in FIG. 1 was completed on the silicon wafer. Polishing slurry had been supplied to the surface to be polished during the chemical mechanical polishing, and contained alumina particles. Upon completion of the chemical mechanical polishing, the silicon wafer was transferred to the loader of the cleaning system for the underwater storage. The silicon wafer was moved to the first chamber of the cleaning system.

Using the rolling brushes 32, the alumina particles were brushed away from both surfaces of the silicon wafer, and the aqueous ammonia at 0.001 weight percent was supplied to both surfaces of the silicon wafer during the brushing. The brushing was continued for 20–60 seconds. After the brushing, the silicon wafer was rinsed in pure water for 5–20 seconds, and residual ammonia was removed from the surfaces of the silicon wafer.

Subsequently, the silicon wafer was moved to the second chamber, and was subjected to the centrifugal spray cleaning. The second chamber was perfectly separated from the first chamber. While the silicon wafer is turning, the washer containing oxalic acid at 0.5 weight percent was sprayed to the major surface of the silicon wafer, and the liquid mixture was sprayed to the reverse surface of the silicon wafer. The liquid mixture was regulated to the ratio between HF, $H_2O_2$ and $H_2O$ of 1:1:100. The second cleaning was continued for 15–30 seconds, and the copper strip 5 and the metallic contaminants were removed from both surfaces of the silicon wafer. After the second cleaning, the silicon wafer was rinsed in pure water for 10–30 seconds. The silicon wafer was placed on a rotor of a spin dryer, and was dried. The silicon wafer was transferred to the unloader.

The present inventors confirmed that the alumina particles, the copper strip 5 and the metallic contaminants were removed from the silicon wafer.

Second Example

A silicon wafer was chemically mechanically polished under the conditions same as the first example, and the semiconductor structure shown in FIG. 1 was completed on the silicon wafer. The silicon wafer was stored in the loader of the cleaning system, and was transferred to the first chamber.

Using the brushes 32, the alumina particles were brushed away from both surfaces of the silicon wafer, and catholyte was sprayed onto both surfaces during the brushing. The catholyte was obtained through the electrolysis of pure water, pH and the oxidation-reduction potential were 7.0 and −650 milli-volts with the reference electrode of AgCl. Upon completion of the first cleaning, the silicon wafer was rinsed as similar to the first example.

The silicon wafer was transferred to the second chamber, and was subjected to the second cleaning under the conditions same as the first example. After the second cleaning, the silicon wafer was rinsed, and dried as similar to the silicon wafer in the first example.

The present inventors confirmed that the alumina particles, the copper strip 5 and the metallic contaminants were removed from the silicon wafer.

Third Example

A silicon wafer was chemically mechanically polished under the conditions same as the first example, and the semiconductor structure shown in FIG. 1 was completed on the silicon wafer. The silicon wafer was stored in the loader of the cleaning system, and was transferred to the first chamber.

Using the brushes 32, the alumina particles were brushed away from both surfaces of the silicon wafer under the conditions same as those in the first example. The silicon wafer was rinsed in the pure water, and was transferred to the second chamber.

The silicon wafer was subjected to the second cleaning under the same conditions except the washer sprayed on the major surface of the silicon wafer. The washer contained oxalic acid at 0.1 weight percent. After the second cleaning, the silicon wafer was rinsed and dried as similar to the silicon wafer in the first example.

The present inventors confirmed that the alumina particles, the copper strip 5 and the metallic contaminants were removed from the silicon wafer.

Fourth Example

A silicon wafer was chemically mechanically polished under the conditions same as the first-example, and the semiconductor structure shown in FIG. 1 was completed on the silicon wafer. The silicon wafer was stored in the loader of the cleaning system, and was transferred to the first chamber.

Using the brushes 32, the alumina particles were brushed away from both surfaces of the silicon wafer under the conditions same as those in the first example. The silicon wafer was rinsed in the pure water, and was transferred to the second chamber.

The silicon wafer was subjected to the second cleaning under the same conditions except the washer sprayed on the major surface of the silicon wafer. The washer contained citric acid at 5 weight percent. After the second cleaning, the silicon wafer was rinsed and dried as similar to the silicon wafer in the first example.

The present inventors confirmed that the alumina particles, the copper strip 5 and the metallic contaminants were removed from the silicon wafer.

Fifth Example

The present inventors prepared silicon wafers, which had the semiconductor structure shown in FIG. 8. The tungsten plugs 25 and the barrier layers 24 had been formed through the chemical mechanical polishing using polishing slurry containing silica particles.

The silica particles were brushed away from the major surfaces of the silicon wafers, and the aqueous ammonia at 0.0001 weight percent was supplied to the major surfaces.

Subsequently, residual metallic contaminants were removed through the centrifugal spray cleaning, and washer containing oxalic acid was sprayed onto the surfaces of the silicon wafer. Different oxalic acid concentrations were given to the washer, and was 0.05 weight percent, 0.1 weight percent, 0.5 weight percent, 1 weight percent and 5 weight percent. The present inventors confirmed that the silica particles and the metallic contaminants were removed from the silicon wafers.

As will be appreciated from the foregoing description, the cleaning method according to the present invention makes both surfaces of a semiconductor wafer clean without damage to the conductive members such as a copper wiring, the tungsten plugs and the barrier layers.

Although particular embodiments of the present invention have been shown and described, it will be apparent to those skilled in the art that various changes and modifications may be made without departing from the spirit and scope of the present invention.

What is claimed is:

1. A method for cleaning a semiconductor wafer having a copper layer exposed to a surface thereof after a chemical mechanical polishing, comprising the steps of:
    a) treating said semiconductor wafer with a first washer selected from the group consisting of aqueous ammonia containing ammonia at 0.0001–0.5 weight percent for removing polishing particles from said semiconductor wafer without damage to said copper layer; and
    b) treating said semiconductor wafer with a second washer containing at least one decontaminating agent selected from the group consisting of polycarboxylic acids each capable of producing a chelate compound together with copper, ammonium salts of said polycarboxylic acids for removing metallic contaminants from said semiconductor wafer.

2. The method as set forth in claim 1, in which a polishing slurry is used during said chemical mechanical polishing, and contains said polishing particles and at least one oxidizing agent serving as a contamination source for at least one of said metallic contaminants.

3. The method as set forth in claim 2 in which said polishing particles are brushed away from said semiconductor wafer, and said first washer allows said polishing particles and said surface to be negatively charged.

4. The method as set forth in claim 3, in which said surface is formed of an insulating material selected from the group consisting of silicon oxide, benzocyclobutene, parrylene-N, cytop, xerogel, hydrogen silisesquiioxane and methylsilane based composite material containing hydrogen peroxide.

5. The method as set forth in claim 1, in which said polycarboxylic acids are oxalic acid, citric acid, D-tartaric acid, L-tartaric acid, malonic acid, malic acid malein acid or succinic acid.

6. The method as set forth in claim 1 in which said ammonium salts are salts of oxalic acid, citric acid, D-tartric acid, L-tartaric acid, malinic acid, malic acid, malein acid or succinic acid.

7. The method as set forth in claim 1 which said second washer is supplied to a major surface of said semiconductor wafer where said copper layer is exposed, and a third washer containing hydrofluoric acid and hydrogen peroxide is supplied to a reverse surface of said semiconductor wafer.

8. The method as set forth in claim 7, in which said hydrofluoric acid, said hydrogen peroxide and water are regulated to 1–10:1–10:200.

9. The method as set forth in claim 1 in which a centrifugal spray cleaning technique is used in said step b).

10. A method for cleaning a semiconductor wafer having a tungsten layer exposed to a surface thereof after a chemical mechanical polishing, comprising the steps of:
    a) treating said semiconductor wafer with a first washer selected from the group consisting of aqueous ammonia containing ammonia at 0.0001–5 weight percent for removing polishing particles from said semiconductor wafer without damage to said tungsten layer; and
    b) treating said semiconductor wafer with a second washer containing at least one decontaminating agent selected from the group consisting of oxalic acid ranging from 0.01 weight percent to 7 weight percent for removing metallic contaminants from said semiconductor wafer.

11. The method as set forth in claim 10, which a polishing slurry is used during said chemical mechanical polishing, and contains said polishing particles and at least one oxidizing agent serving as a contamination source for at least one of said metallic contaminants.

12. The method as set forth in claim 11, in which said polishing particles are brushed away from said semiconductor wafer, and said first washer allows said polishing particles and said surface to be negatively charged.

13. The method as set forth in claim 12, in which said surface is formed of an insulating material selected from the group consisting of silicon oxide, benzocyclobutene, parrylene-N, cytop, xerogel, hydrogen silisesquiioxane and methylsilane based composite material containing hydrogen peroxide.

14. The method as set forth in claim 10, in which said second washer is supplied to a major surface of said semiconductor wafer where said tungsten layer is exposed, and a third washer containing hydrofluoric acid and hydrogen peroxide is supplied to a reverse surface of said semiconductor wafer.

15. The method as set forth in claim 14, which said hydrofluoric acid, said hydrogen peroxide and water are regulated to 1–10:1–10:200.

16. The method as set forth in claim 10, in which a centrifugal spray cleaning technique is used in said step b).

* * * * *